(12) United States Patent
Pu et al.

(10) Patent No.: US 12,199,047 B2
(45) Date of Patent: Jan. 14, 2025

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Chao-Chiang Pu, Taichung (TW); Chi-Ching Ho, Taichung (TW); Yi-Min Fu, Taichung (TW); Yu-Po Wang, Taichung (TW); Po-Yuan Su, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 159 days.

(21) Appl. No.: 17/572,001

(22) Filed: Jan. 10, 2022

(65) Prior Publication Data
US 2023/0154865 A1  May 18, 2023

(30) Foreign Application Priority Data
Nov. 15, 2021  (TW) .................. 110142399

(51) Int. Cl.
| | |
|---|---|
| *H01L 23/00* | (2006.01) |
| *H01L 21/48* | (2006.01) |
| *H01L 23/31* | (2006.01) |
| *H01L 23/367* | (2006.01) |
| *H01L 23/498* | (2006.01) |
| *H01L 23/58* | (2006.01) |
| *H01L 23/42* | (2006.01) |
| *H05K 1/02* | (2006.01) |

(52) U.S. Cl.
CPC ........ *H01L 23/562* (2013.01); *H01L 21/4882* (2013.01); *H01L 23/3107* (2013.01); *H01L 23/367* (2013.01); *H01L 23/49822* (2013.01); *H01L 23/585* (2013.01); *H01L 23/42* (2013.01); *H05K 1/0203* (2013.01)

(58) Field of Classification Search
CPC .............. H01L 23/562; H01L 21/4882; H01L 23/3107; H01L 23/367; H01L 23/49822; H01L 23/585; H01L 23/3135; H01L 25/0652; H01L 25/16; H01L 21/561; H01L 23/053; H01L 2221/68345; H01L 2221/68359; H01L 21/6835; H01L 23/49811; H01L 24/24; H01L 24/82; H01L 23/3675; H01L 23/49816; H01L 23/5389; H01L 23/13; H01L 23/42; H05K 1/0203
See application file for complete search history.

(56) References Cited

U.S. PATENT DOCUMENTS

| | | | | |
|---|---|---|---|---|
| 2017/0188448 | A1* | 6/2017 | Liang | H01L 23/42 |
| 2020/0090952 | A1* | 3/2020 | Yeh | H01L 21/56 |
| 2020/0185300 | A1* | 6/2020 | Xu | H01L 23/5385 |
| 2020/0381336 | A1* | 12/2020 | Otsubo | H01L 23/49822 |

* cited by examiner

*Primary Examiner* — Patricia D Valenzuela
(74) *Attorney, Agent, or Firm* — Dority & Manning, P.A.

(57) ABSTRACT

An electronic package is provided in which an electronic module and a heat dissipation structure combined with the electronic module are disposed on a carrier structure, and at least one adjustment structure is coupled with the heat dissipation structure and located around the electronic module. Therefore, the adjustment structure disperses thermal stress to avoid warpage of the electronic module.

6 Claims, 8 Drawing Sheets

ELECTRONIC PACKAGE AND MANUFACTURING METHOD THEREOF

BACKGROUND

1. Technical Field

The present invention relates to a semiconductor device, and more particularly, to an electronic package and a manufacturing method thereof.

2. Description of Related Art

With the vigorous development of portable electronic products in recent years, various related products have been gradually developing toward high-density, high-performance, and being light, thin, short, and small. Various types of semiconductor packaging structures that are applied to the portable electronic products are thus rolled out, in order to meet the demands for lightweight, thinness, small size and high-density.

FIG. 1 is a schematic cross-sectional view of a conventional semiconductor package 1. As shown in FIG. 1, the semiconductor package 1 is provided with at least one electronic module 1a on a packaging substrate 19 in a flip-chip manner, and a heat sink 17 on the packaging substrate 19 for covering the electronic module 1a.

However, in the conventional semiconductor package 1, since the electronic module 1a has a large size, a mismatch between the coefficient of thermal expansion (CTE) of a semiconductor chip 11 and that of a packaging material 15 would easily result in non-uniform thermal stress, causing the electronic module 1a to warp during thermal cycles.

Therefore, how to overcome the above-mentioned flaws of the conventional techniques has become an urgent problem to be solved at present.

SUMMARY

In view of the various deficiencies of the conventional techniques, the present invention provides an electronic package comprising: a carrier structure; an electronic module provided on the carrier structure and electrically connected thereto; a heat dissipation structure coupled with the electronic module; and adjustment structures coupled with the heat dissipation structure and located around the electronic module.

The present invention also provides a manufacturing method of an electronic package, comprising: providing an electronic module on a carrier structure, wherein the electronic module is electrically connected to the carrier module; coupling a heat dissipation structure with the electronic module; and coupling adjustment structures with the heat dissipation structure, wherein the adjustment structures are located around the electronic module.

In the aforementioned electronic package and manufacturing method thereof, the heat dissipation structure has a seat portion extending to the carrier structure.

In the aforementioned electronic package and manufacturing method thereof, the adjustment structures are made of a metal or semiconductor material.

In the aforementioned electronic package and manufacturing method thereof, the adjustment structures are rings.

The aforementioned electronic package and manufacturing method thereof further comprise forming a first packaging layer covering the electronic module and a second packaging layer covering the adjustment structures and the first packaging layer on the carrier structure. For example, the hardness of the first packaging layer is greater than that of the second packaging layer.

The aforementioned electronic package and manufacturing method thereof further comprise covering the electronic module and the adjustment structures with a packaging layer.

The aforementioned electronic package and manufacturing method thereof further comprise covering the electronic module but not the adjustment structures with a packaging layer.

It can be seen from the above that, in the electronic package and the manufacturing method thereof of the present invention, thermal stress can be dispersed mainly by combining the adjustment structures with the heat dissipation structure and locating the adjustment structures around the electronic module. Therefore, compared with the conventional techniques, the present invention can avoid warpage of the electronic module during thermal cycling.

DETAILED DESCRIPTIONS

The following describes the implementation of the present invention with specific examples. Those skilled in the art can easily understand other advantages and effects of the present invention from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "first," "second" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIGS. 2A to 2H are schematic cross-sectional views of a first embodiment of a manufacturing method of an electronic package 2 of the present invention.

Figure 1:
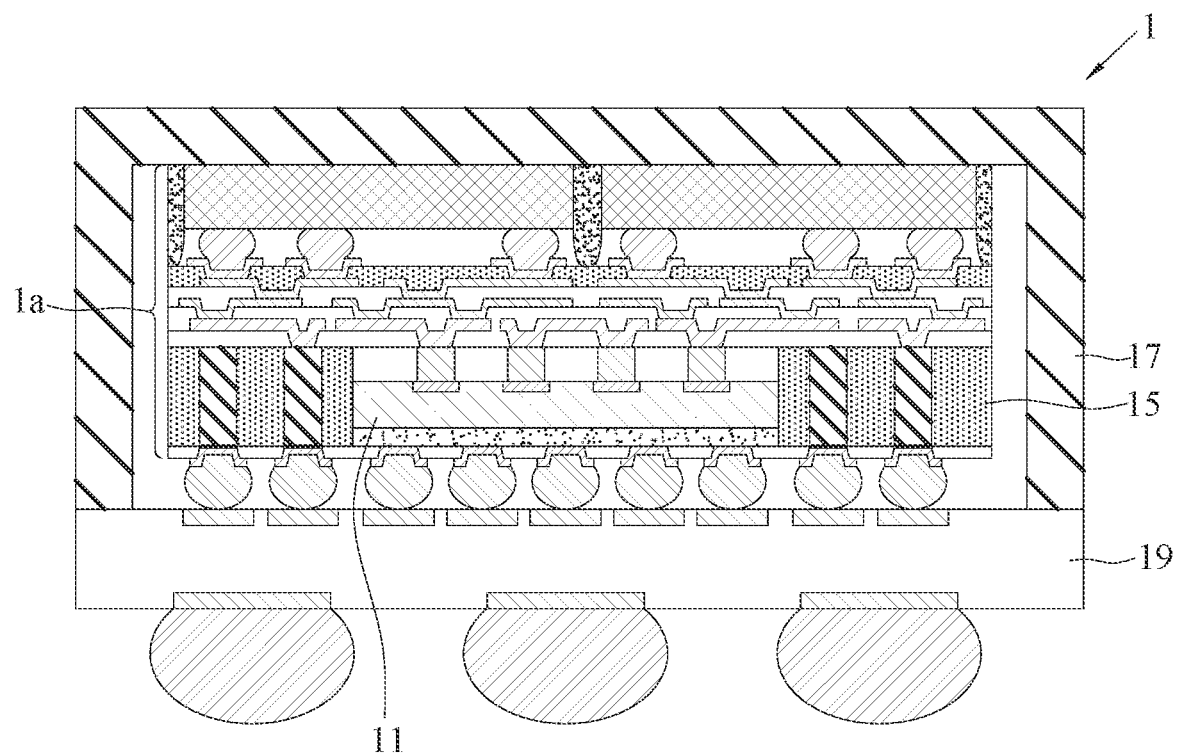
FIG. 1 is a schematic cross-sectional view of a conventional semiconductor package.
Figure 2A:
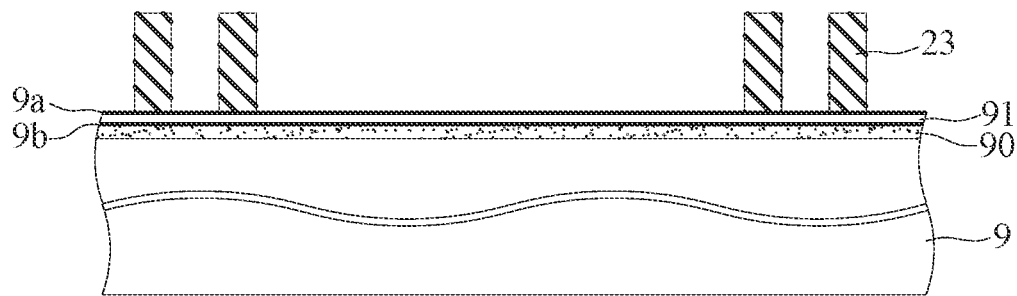
FIGS. 2A to 2H are schematic cross-sectional views of a first embodiment of a manufacturing method of an electronic package of the present invention.
Figure 2B:
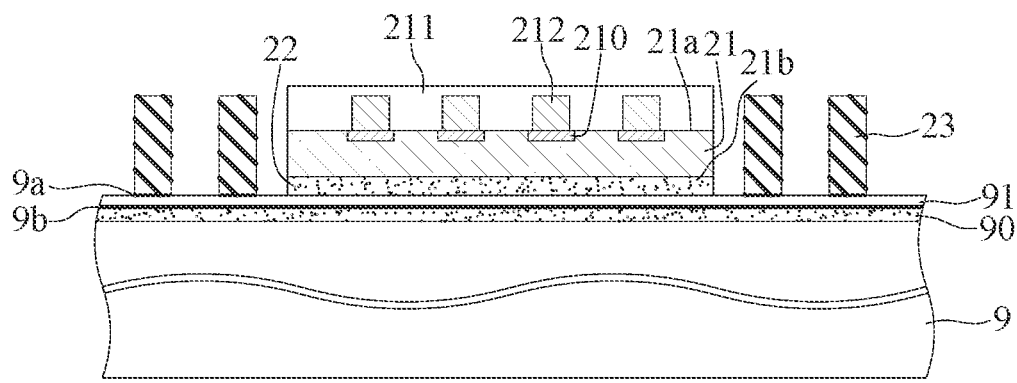

As shown in FIGS. 2A and 2B, a carrier board 9 with a seed layer 9a is provided, and a plurality of conductive pillars 23 are formed on the carrier board 9 by the seed layer 9a. Then, at least one first electronic element 21 is disposed on the carrier board 9, wherein the first electronic element 21 is combined with and electrically connected to a plurality of conductors 212. The conductor 212 is, but not limited to, for example, a conductive circuit, in a spherical shape of a solder ball, or in a pillar shape of a metal material such as a copper pillar and a solder bump, or a stud-shaped conductive member made by a wire bonding machine.

In this embodiment, the carrier board 9 is, for example, a board of a semiconductor material (such as silicon or glass), on which a release layer 90, a metal layer 9b of, for example, titanium/copper and an insulating layer 91 of, for example, a dielectric material or a solder mask are sequentially formed by coating, so that the seed layer 9a is disposed on the insulating layer 91.

Furthermore, in FIG. 2A, a patterned resist layer (omitted from the figure) may be formed on the seed layer 9a, so that the resist layer exposes partial surfaces of the seed layer 9a to have the conductive pillars 23 provided thereon. After the conductive pillars 23 are fabricated, the patterned resist layer and the seed layer 9a underneath are removed, as shown in FIG. 2B.

In addition, the material forming the conductive pillars 23 is a metal material such as copper or a solder material, and the material forming the seed layer 9a is, for example, titanium/copper.

In addition, the first electronic element 21 is an active element, a passive element, or a combination of both, in which the active element is, for example, a semiconductor chip, and the passive element is, for example, a resistor, a capacitor and an inductor. In this embodiment, the first electronic element 21 is a semiconductor chip, which has an active surface 21a and a non-active surface 21b opposite to each other. The first electronic element 21 is adhered to the insulating layer 91 with its non-active surface 21b via a bonding layer 22, and the active surface 21a is provided with a plurality of electrode pads 210 and a protective film 211 of, for example, a passivation material, with the conductors 212 provided in the protective film 211.

Figure 2C:
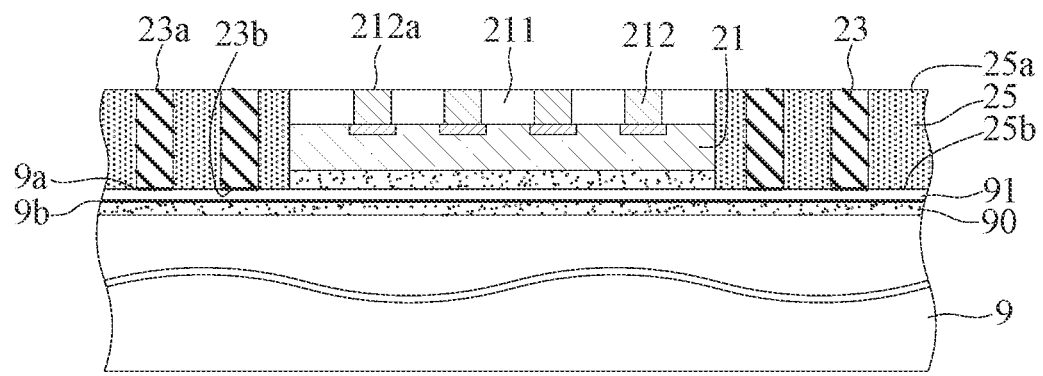

As shown in FIG. 2C, a first cladding layer 25 is formed on the insulating layer 91 of the carrier board 9, such that the first cladding layer 25 covers the first electronic element 21, the conductors 212 and the conductive pillars 23, wherein the first cladding layer 25 has a first surface 25a and a second surface 25b opposite to each other, so that the protective film 211, end surfaces 212a of the conductors 212 and end surfaces 23a of the conductive pillars 23 are exposed from the first surface 25a of the first cladding layer 25, and so that the first cladding layer 25 is bonded to the insulating layer 91 of the carrier board 9 with its second surface 25b.

In this embodiment, the first cladding layer 25 is an insulating material, such as polyimide (abbreviated as PI), a dry film, or an encapsulant of, for example epoxy or a packaging material (molding compound). For example, the first cladding layer 25 can be formed on the insulating layer 91 following a manufacturing process selected from such methods as liquid compound, injection, lamination or compression molding.

Furthermore, the first surface 25a of the first cladding layer 25 can be made flush with the protective film 211, the end surfaces 23a of the conductive pillars 23 and the end surfaces 212a of the conductors 212 by a planarization process, such that the end surfaces 23a of the conductive pillars 23 and the end surfaces 212a of the conductors 212 are exposed on the first surface 25a of the first cladding layer 25. For example, the planarization process removes partial materials of the protective film 211, the conductive pillars 23, the conductors 212 and the first cladding layer 25 by means of polishing.

In addition, the other end surfaces 23b of the conductive pillars 23 (which are ignored due to the extremely small thickness of the seed layer 9a) can also be substantially flush with the second surface 25b of the first cladding layer 25.

Figure 2D:
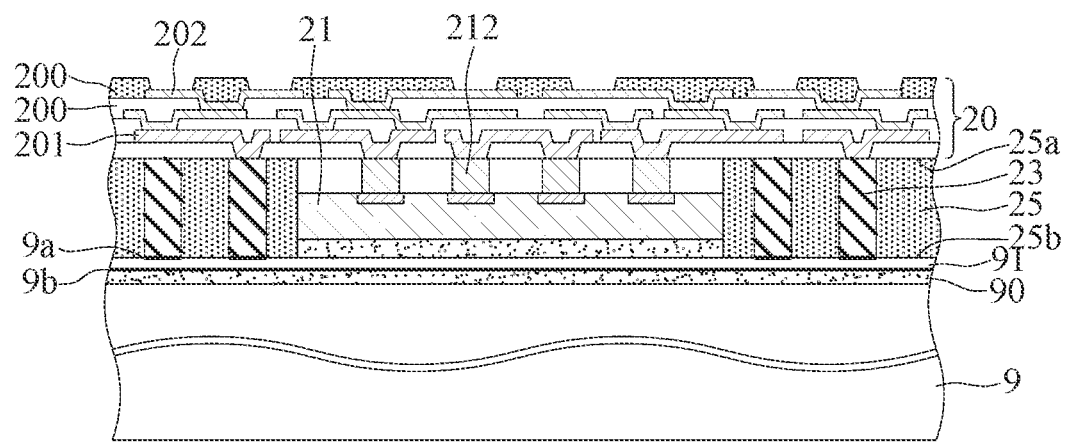

As shown in FIG. 2D, a circuit structure 20 is formed on the first surface 25a of the first cladding layer 25, and the circuit structure 20 is electrically connected to the conductive pillars 23 and the conductors 212.

In this embodiment, the circuit structure 20 includes a plurality of insulating layers 200 and a plurality of redistribution layers (RDL) 201 disposed on the insulating layers 200, wherein the outermost insulating layer 200 can be used as a solder resist layer, and the outermost redistribution layer 201 is exposed to the solder resist layer to serve as an electrical contact pad 202, such as a micro pad (commonly known as μ-pad). Alternatively, the circuit structure 20 can also simply include a single insulating layer 200 and a single redistribution layer 201.

Furthermore, the material forming the redistribution layer 201 is copper, and the material forming the insulating layer 200 is a dielectric material such as polybenzoxazole (PBO), polyimide (PI) and Prepreg (PP), or a solder resist material such as green paint and ink.

Figure 2E:
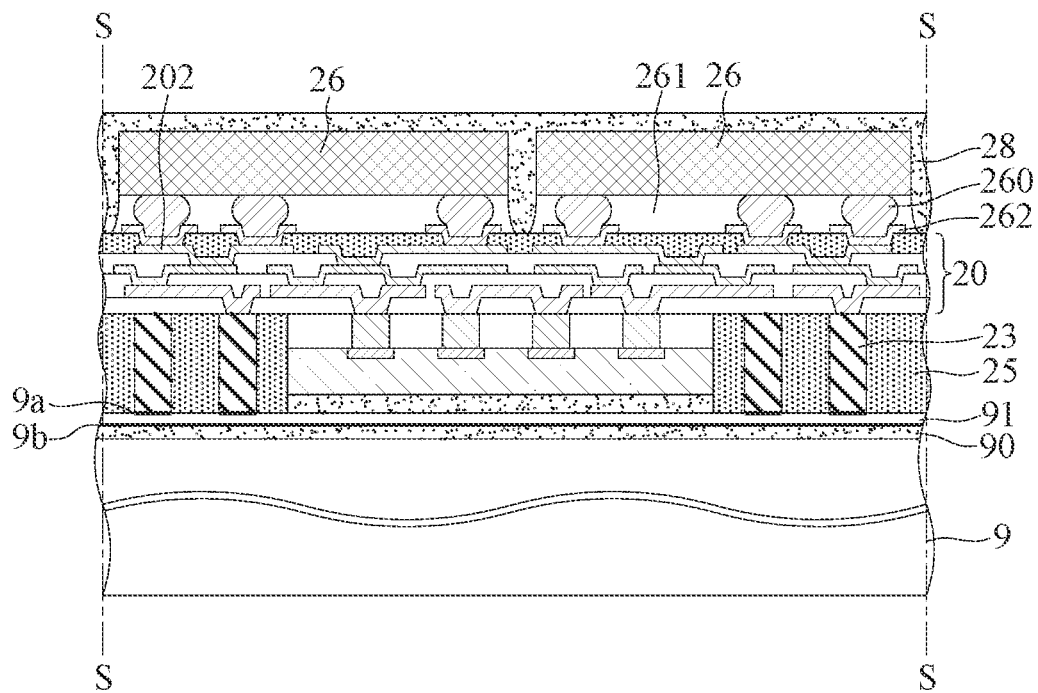

As shown in FIG. 2E, at least one second electronic element 26 is disposed on the circuit structure 20, and a second cladding layer 28 is provided to cover the second electronic element 26. In this embodiment, two second electronic elements 26 are disposed on the circuit structure 20.

In this embodiment, the second electronic element 21 is an active element, a passive element, or a combination of both, in which the active element is, for example, a semiconductor chip, and the passive element is, for example, a resistor, a capacitor and an inductor. In an aspect of the embodiment, the second electronic element 26 is, for example, a semiconductor chip such as a graphics processing unit (GPU), a high bandwidth memory (HBM), etc., and there are no particular limits thereto.

Furthermore, the second electronic element 26 is electrically connected to the electrical contact pads 202 through a plurality of conductive bumps 260 such as solder bumps, copper bumps or others, and the second cladding layer 28 can cover the second electronic element 26 and the conductive bumps 260 at the same time. In this embodiment, under bump metallurgies (abbreviated as UBM) 262 may be formed on the electrical contact pads 202 to facilitate the bonding of the conductive bumps 260.

In addition, the second cladding layer 28 is an insulating material, such as polyimide (abbreviated as PI), a dry film, or an encapsulant such as epoxy or a packaging material (molding compound), which can be formed on the circuit structure 20 by such methods as lamination or compression molding. It should be understood that the material forming the second cladding layer 28 may be the same or different from the material of the first cladding layer 25.

In addition, an underfill 261 may be formed between the second electronic element 26 and the circuit structure 20 to cover the conductive bumps 260, and then the second cladding layer 28 may be formed to cover the underfill 261 and the second electronic element 26.

Figure 2F:
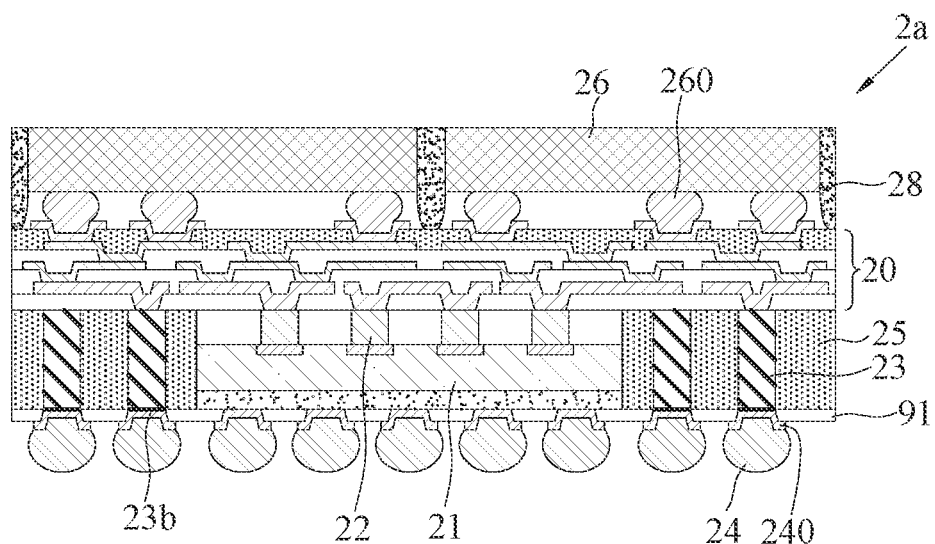

As shown in FIG. 2F, the carrier board 9 along the release layer 90 and the metal layer 9b thereon are removed, whereas the insulating layer 91 is retained. Next, circuit portions 240 are formed on the insulating layer 91 to electrically connect the conductive pillars 23. After that, a singulation process is performed along a cutting path S shown in FIG. 2E to obtain a plurality of electronic modules 2a.

In this embodiment, when the release layer 90 is peeled off, the metal layer 9b is used as a barrier to avoid damaging the insulating layer 91. After removing the carrier board 9 and the release layer 90 thereon, the metal layer 9b is removed by etching.

Furthermore, the insulating layer 91 is formed with a plurality of openings by a laser method, such that the end surfaces 23b of the conductive pillars 23 and a partial second surface 25b of the first cladding layer 25 are exposed in the openings for bonding the circuit portion 240s. For example, the circuit portions 240 are under bump metallurgies (UBM) for bonding conductive elements 24 such as a plurality of solder bumps or solder balls (C4 type). It should be understood that when the number of the contacts (IO) is insufficient, a RDL process may be employed to build up on the insulating layer 91 to reconfigure the number of IOs and the positions of the conductive elements 24.

In addition, a planarization process, such as polishing, can be used to remove partial materials of the second cladding layer 28, so that the upper surface of the second cladding layer 28 is flush with that of the second electronic element 26. As a result, the second electronic element 26 is exposed on the second cladding layer 28 (as shown in FIG. 2F).

In addition, with the carrier board 9 having an insulating layer 91, as provided in the present application, there is no need to arrange a dielectric layer as the insulating layer 91 can be used to form the circuit portions 240 after the carrier board 9 is removed. Therefore, both time and steps can be saved to achieve the purpose of reducing process costs.

Figure 2G:
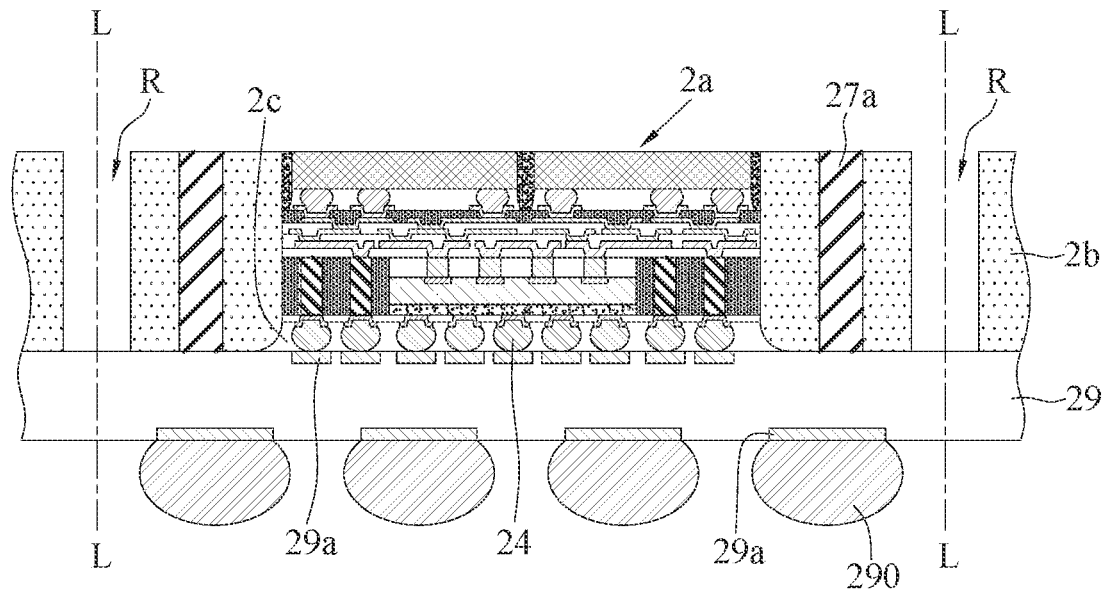

As shown in FIG. 2G, the electronic module 2a is disposed on a carrier structure 29 of a full-page specification through the conductive elements 24, and a packaging layer 2b covering the electronic module 2a is formed on the carrier structure 29, wherein a plurality of adjustment structures 27a embedded in the packaging layer 2b are arranged on the carrier structure 29, and the adjustment structures 27a surround the electronic module 2a.

In this embodiment, the carrier structure 29 is, for example, a packaging substrate with a core layer or a coreless packaging substrate, which has an insulating base and a circuit layer 29a combined therewith. The circuit layer 29a is, for example, a fan out type redistribution layer (RDL). For example, the material forming the circuit layer 29a is, for example, copper, and the material forming the insulating base is, for example, a dielectric material such as polybenzoxazole (PBO), polyimide (PI), or prepreg (PP), etc. It should be understood that the carrier structure can also be other carrier units for carrying electronic elements, such as a lead frame or a silicon interposer, and is not limited to the abovementioned ones.

Furthermore, an underfill 2c can be formed between the carrier structure 29 and the electronic module 2a to cover the conductive elements 24, and then the underfill 2c and the electronic module 2a can be covered with the packaging layer 2b. An underside of the carrier structure 29 can be subjected to a ball planting process to form a plurality of conductive elements 290 such as solder balls, so that the carrier structure 29 can be connected to a circuit board (omitted from the picture) with the conductive elements 290 at its underside in a subsequent process.

Furthermore, a groove R is formed along the cutting path L on the packaging layer 2b, so that partial surfaces of the carrier structure 29 are exposed in the groove R. The packaging layer 2b is made of an insulating material, such as polyamide (PI), dry film, or an encapsulant such as epoxy or a packaging material (molding compound), and can be formed on the carrier structure 29 by such methods as lamination or compression molding. It should be understood that the material forming the packaging layer 2b may be the same or different from the material of the first and/or second cladding layer 25, 28.

In addition, the adjustment structures 27a are metal rings of, for example, a copper material or rings of a semiconductor material like silicon or glass, which can be arranged on the carrier structure 29 by electroplating, adhering or other methods. In addition, partial materials of the packaging layer 2b, the adjustment structures 27a and the electronic module 2a can be removed by a planarization process, such as polishing, to make the top surface of the packaging layer 2b flush with the end surfaces of the adjustment structures 27a and the top surface of the electronic module 2a, such that the end surfaces of the adjustment structures 27a and the top surface of the electronic module 2a are exposed from the top surface of the packaging layer 2b.

Figure 2H:
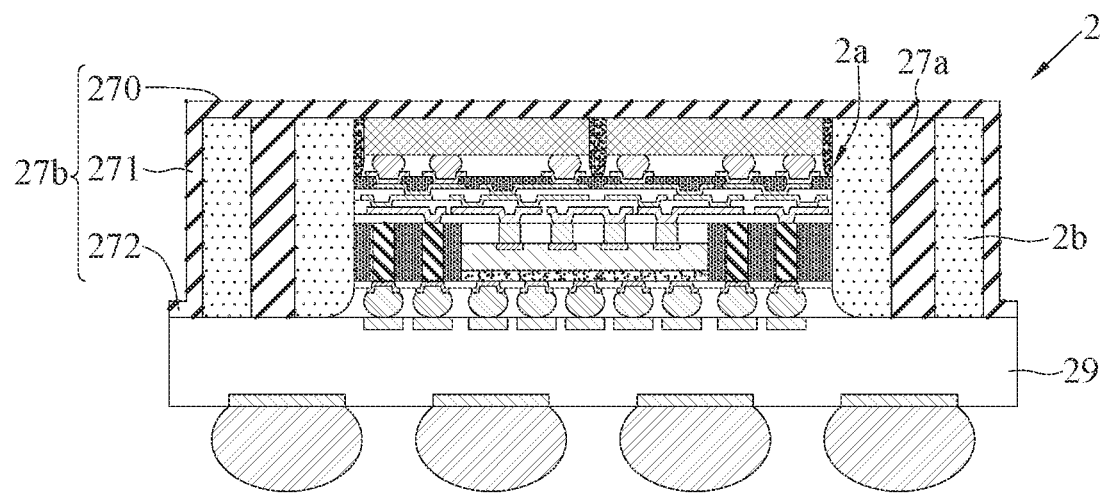

As shown in FIG. 2H, a singulation process is performed along the cutting path L shown in FIG. 2G, and then a heat dissipation structure 27b is formed on the packaging layer 2b to produce an electronic package 2.

In this embodiment, the heat dissipation structures 27b are metallic bodies formed on the packaging layer 2b by electroplating, deposition or other methods to contact the adjustment structures 27a. For example, the heat dissipation structure 27b includes a sheet 270 formed on the top surface of the packaging layer 2b to contact the adjustment structures 27a and at least one leg portion 271 formed on a side surface of the packaging layer 2b, and extends to partial surfaces of the carrier structure 29 to serve as a seat portion 272, wherein the seat portion 272 protrudes from the leg portion 271.

Therefore, in the manufacturing method of the present invention, thermal stress is dispersed mainly by the adjustment structures 27a. When the electronic module 2a is of a large size, thermal stress concentration can still be avoided even if the coefficients of thermal expansion of the first electronic element 21 and the first cladding layer 25 (or the coefficients of thermal expansion of the second electronic element 26 and the second cladding layer 28) do not match. Consequently, compared with the conventional techniques, the electronic package 2 of the present invention can avoid warpage of the electronic module 2a during thermal cycling.

Figure 3A:
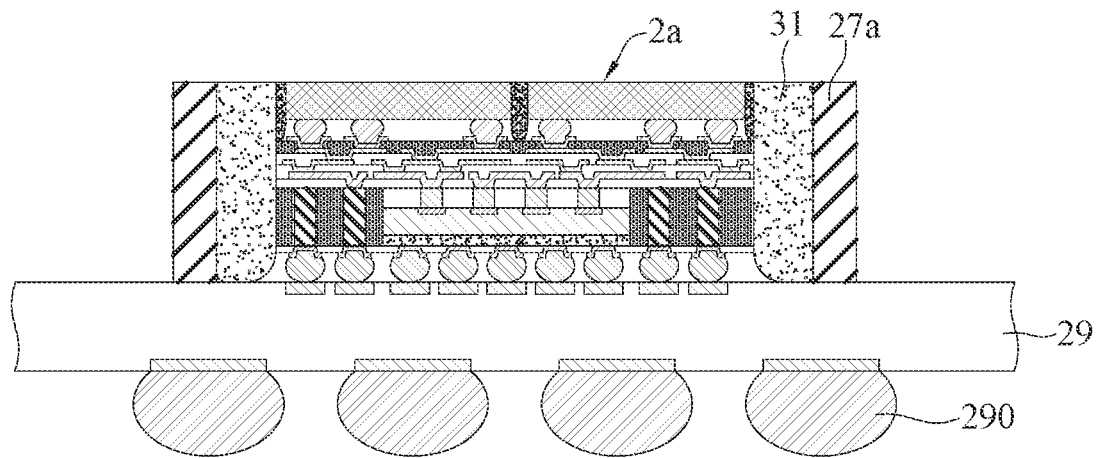
FIGS. 3A to 3C are schematic cross-sectional views of a second embodiment of a manufacturing method of an electronic package of the present invention.
Figure 3B:
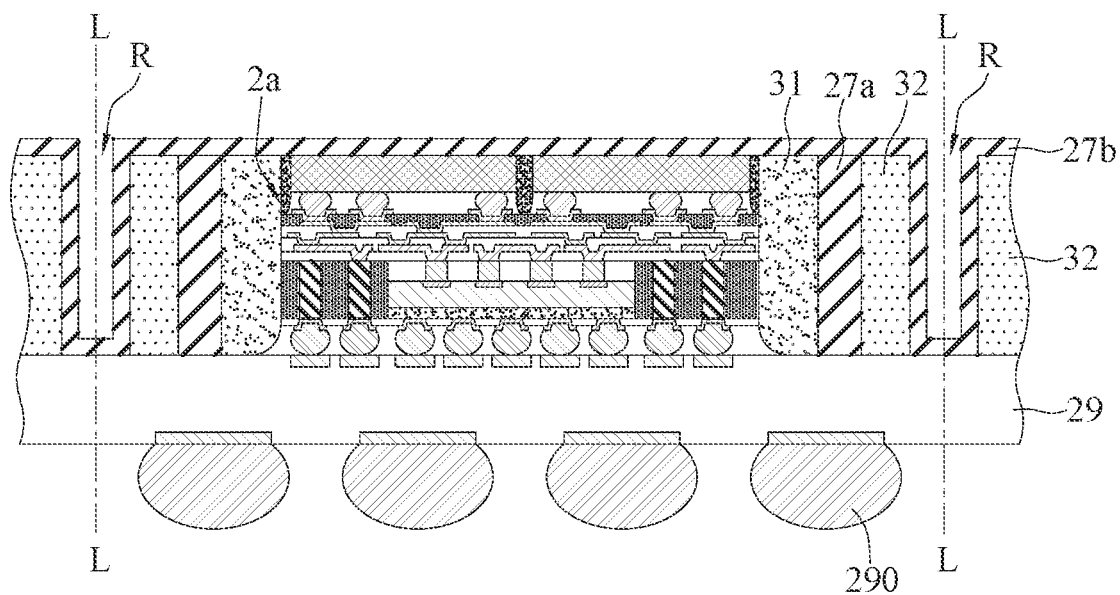

FIGS. 3A to 3B are schematic cross-sectional views of a second embodiment of a manufacturing method of an electronic package 3 of the present invention. The difference between this embodiment and the first embodiment lies in the production of the packaging layer, so the similarities will not be repeated in the following.

As shown in FIG. 3A, in the manufacturing process depicted in FIG. 2G, a first packaging layer 31 is formed on the carrier structure 29, the first packaging layer 31 covering the electronic module 2a but not the outer peripheral surfaces of the adjustment structures 27a, such that the peripheral surfaces of the adjustment structures 27a are exposed to the first packaging layer 31.

In this embodiment, the first packaging layer 31 is an insulating material, such as polyamide (abbreviated as PI), dry film, or an encapsulant of, for example, epoxy or a packaging material (molding compound), which can be formed on the carrier structure 29 by such methods as lamination or compression molding. It should be understood that the material forming the first packaging layer 31 may be the same or different from the material of the first and/or second cladding layer 25, 28.

Furthermore, the material forming the adjustment structures 27a is a metal material such as copper, or a solder material. A planarization process, such as a polishing method, can be employed to remove partial materials of the first packaging layer 31, the adjustment structures 27a and the electronic module 2a, to make the top surface of the first packaging layer 31 flush with the end surfaces of the adjustment structures 27a and the top surface of the electronic module 2a, so that the end surfaces of the adjustment structures 27a and the top surface of the electronic module 2a are exposed on the top surface of the first packaging layer 31.

As shown in FIG. 3B, a second packaging layer 32 covering the peripheral surfaces of the adjustment structures 27a and the first packaging layer 31 is formed on the carrier structure 29, and a groove R is formed along the cutting path L on the second packaging layer 32 to expose partial surfaces of the carrier structure 29 to the groove R. A heat dissipation structure 27b covering exposed parts of the carrier structure 29 is formed on the second packaging layer 32 and wall surfaces of the groove R.

In this embodiment, the second packaging layer 32 is an insulating material, such as polyamide (abbreviated as PI), dry film, or an encapsulant of, for example, epoxy or a packaging material (molding compound), which can be formed on the carrier structure 29 by such methods as lamination or molding. It should be understood that the material forming the second packaging layer 32 may be the same or different from the material of the first and/or second cladding layer 25, 28. For example, the hardness of the first packaging layer 31 may be greater than the hardness of the second packaging layer 32.

Furthermore, a planarization process, such as polishing, can be employed to remove partial materials of the second packaging layer 32, so that the top surface of the second packaging layer 32 is flush with the top surface of the first packaging layer 31. Thereafter, the heat dissipation structure 27b is provided.

Figure 3C:
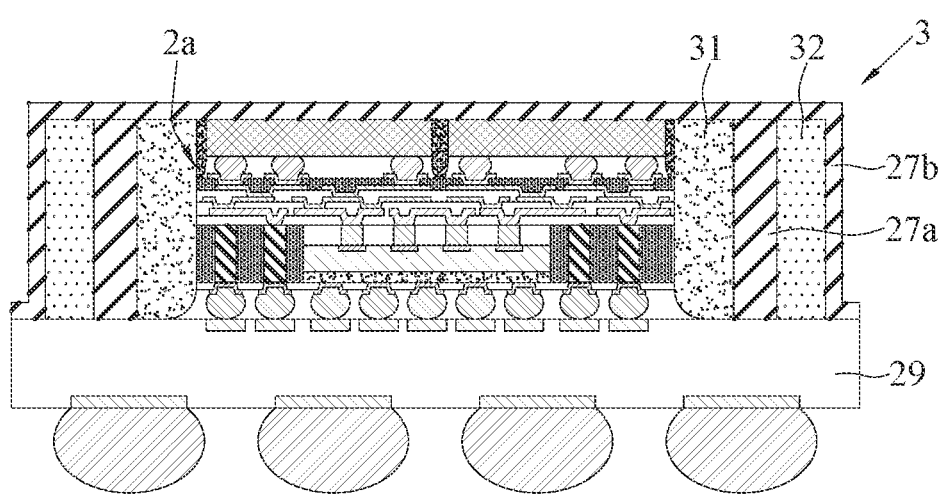

As shown in FIG. 3C, a singulation process is performed along the cutting path L shown in FIG. 3B to produce an electronic package 3.

Figure 4A:
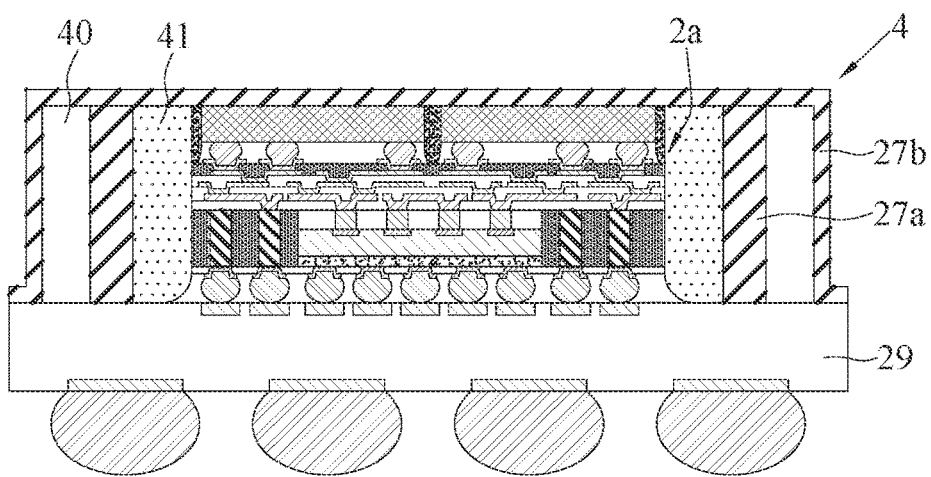
FIGS. 4A and 4B are other different schematic cross-sectional views of FIG. 3C.
Figure 4B:
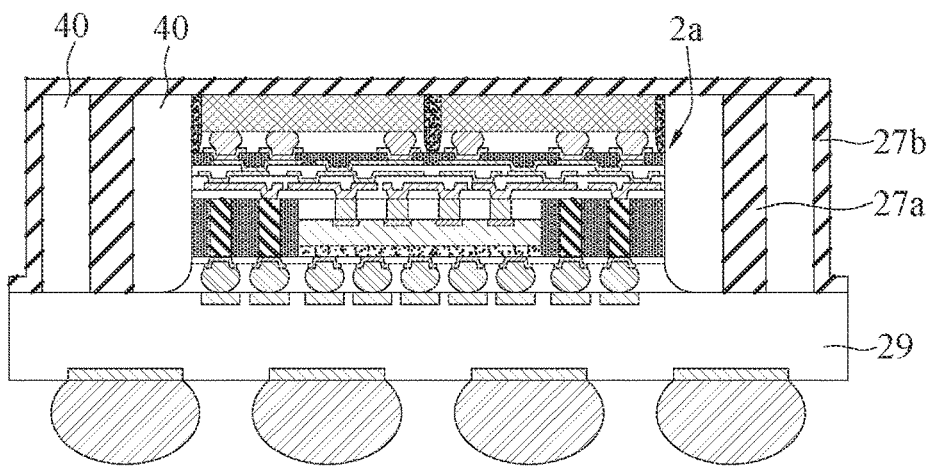

In the foregoing embodiment, the carrier structure 29 is subjected to two packaging processes to form the first packaging layer 31 and the second packaging layer 32. However, it should be understood that, as shown in an electronic package 4 depicted in FIG. 4A, the carrier structure 29 can be formed with only the first packaging layer as required, and the configuration of the second packaging layer is omitted, so that a cavity 40 is formed between the heat dissipation structure 27b and the adjustment structures 27a. The first packaging layer 41 is thereby formed between the electronic module 2a and the adjustment structures 27a, such that the peripheral surfaces of the adjustment structures 27a are exposed to the first packaging layer 41. Furthermore, as shown in FIG. 4B, the carrier structure 29 can also be free from the packaging processes (that is, the configurations of the first packaging layer and the second packaging layer being omitted) as required, to form a cavity 40 in the heat dissipation structure 27b.

Figure 4C:
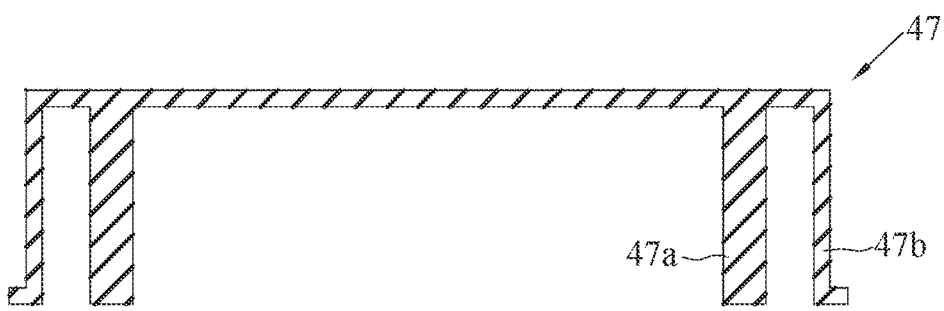
FIG. 4C is a schematic partial cross-sectional view of another aspect of FIG. 4B.

Furthermore, the adjustment structures 27a can be arranged on the carrier structure 29 by electroplating, adhering or other methods, and the heat dissipation structure 27b is a metal frame, which is provided on the carrier structure 29 by adhering. It should be understood that if the adjustment structures and the heat dissipation structure are both provided on the carrier structure 29 by adhering, as shown in FIG. 4C, the adjustment structures 47a and the heat dissipation structure 47b can be an integrally formed frame 47.

Therefore, in the manufacturing method of the present invention, thermal stress is dispersed mainly using adjustment structures 27a, 47a. When the electronic module 2a is of a large size, thermal stress concentration can still be avoided even if the coefficients of thermal expansion of the first electronic element 21 and the first cladding layer 25 (or the coefficients of thermal expansion of the second electronic element 26 and the second cladding layer 28) do not match. As such, compared with the conventional techniques, the electronic packages 3, 4 of the present invention can be free from warpage of the electronic module 2a during thermal cycling.

The present invention also provides an electronic package 2, 3, 4, comprising: a carrier structure 29, at least one electronic module 2a, a heat dissipation structure 27b, 47b, and at least one adjustment structure 27a, 47a.

Said electronic module 2a is disposed on the carrier structure 29 and electrically connected to the carrier structure 29.

Said heat dissipation structure 27b, 47b is combined with the electronic module 2a.

Said adjustment structures 27a, 47a are combined with the heat dissipation structure 27b, 47b and located around the electronic module 2a.

In one embodiment, the heat dissipation structure 27b, 47b has a seat portion 272 extending to the carrier structure 29.

In one embodiment, the adjustment structures 27a, 47a are made of a metal or semiconductor material.

In one embodiment, the adjustment structures 27a, 47a are rings.

In one embodiment, a first packaging layer 31 covering the electronic module 2a, and a second packaging layer 32 covering the adjustment structures 27a, 47a and the first packaging layer 31 are formed on the carrier structure 29. For example, the hardness of the first packaging layer 31 is greater than the hardness of the second packaging layer 32.

In one embodiment, said electronic package 2 further includes a packaging layer 2b covering the electronic module 2a and the adjustment structures 27a, 47a.

In one embodiment, said electronic package 4 further includes a first packaging layer 41 covering the electronic module 2a but not the adjustment structures 27a, 47a. Alternatively, the packaging process may be omitted, so that a cavity 40 is formed in the heat dissipation structure 27b.

In summary, in the electronic package of the present invention and the manufacturing method thereof, thermal stress is dispersed by the design of the adjustment structures. Therefore, when the electronic module is of a large size, thermal stress concentration can still be avoided even if the coefficients of thermal expansion of the electronic element and the cladding layer do not match. Thereby, warpage of the electronic module is avoided during thermal cycling.

The foregoing embodiments are provided only for the purpose of illustrating the principles and effects of the present invention, rather than limiting the present disclosure. Anyone skilled in the art can modify and alter the above embodiments without departing from the spirit and scope of the present disclosure. Therefore, the scope of protection with regard to the present disclosure should be as defined in the accompanying Claims listed below.

What is claimed is:

1. An electronic package, comprising:

a carrier structure;

an electronic module provided on the carrier structure and electrically connected thereto;

a heat dissipation structure including a sheet and at least one leg portion, wherein the sheet is in direct contact with the electronic module, and the leg portion extends outward from the sheet to the carrier structure;

adjustment structures coupled with the heat dissipation structure and located around the electronic module; and a packaging structure provided on the carrier structure and covering the electronic module, wherein the adjustment structures are embedded within the packaging structure.

2. The electronic package of claim 1, wherein the heat dissipation structure has a seat portion extending to the carrier structure.

3. The electronic package of claim 1, wherein the adjustment structures are made of a metal material or a semiconductor material.

4. The electronic package of claim 1, wherein the adjustment structures are rings.

5. The electronic package of claim 1, wherein the packaging structure includes a first packaging layer and a second packaging layer, wherein the first packaging layer covering the electronic module, and the second packaging layer covering the adjustment structures and the first packaging layer are formed on the carrier structure.

6. The electronic package of claim 5, wherein the hardness of the first packaging layer is greater than the hardness of the second packaging layer.

\* \* \* \* \*